(12) United States Patent
Phan et al.

(10) Patent No.: US 6,915,177 B2
(45) Date of Patent: Jul. 5, 2005

(54) COMPREHENSIVE INTEGRATED LITHOGRAPHIC PROCESS CONTROL SYSTEM BASED ON PRODUCT DESIGN AND YIELD FEEDBACK SYSTEM

(75) Inventors: Khoi A. Phan, San Jose, CA (US); Bhanwar Singh, Morgan Hill, CA (US); Bharath Rangarajan, Santa Clara, CA (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 295 days.

(21) Appl. No.: 10/261,569

(22) Filed: Sep. 30, 2002

(65) Prior Publication Data

US 2004/0063009 A1 Apr. 1, 2004

(51) Int. Cl.[7] .......................... G06F 19/00; H01L 21/66
(52) U.S. Cl. .......................... 700/109; 700/121; 438/14
(58) Field of Search .............................. 700/28, 32, 51, 700/96, 121, 108–110; 438/5, 14; 702/182

(56) References Cited

U.S. PATENT DOCUMENTS

| | | | |
|---|---|---|---|
| 5,351,202 A | * 9/1994 | Kurtzberg et al. | ............ 702/81 |
| 5,438,527 A | 8/1995 | Feldbaumer et al. | |
| 5,481,475 A | 1/1996 | Young | |
| 5,546,312 A | * 8/1996 | Mozumder et al. | ............ 700/97 |
| 5,642,296 A | * 6/1997 | Saxena | ......................... 702/84 |
| 5,822,218 A | * 10/1998 | Moosa et al. | ................... 716/4 |
| 6,248,602 B1 | * 6/2001 | Bode et al. | ..................... 438/14 |
| 6,274,394 B1 | 8/2001 | Cha | |
| 6,301,516 B1 | * 10/2001 | Ostrowski et al. | .......... 700/109 |
| 6,470,231 B1 | * 10/2002 | Yang et al. | ................. 700/121 |
| 6,535,775 B1 | * 3/2003 | Bagepalli et al. | ........... 700/109 |
| 6,582,618 B1 | 6/2003 | Toprac et al. | |
| 2002/0072003 A1 | 6/2002 | Brill et al. | |
| 2002/0169581 A1 | * 11/2002 | Sarfert | ....................... 702/182 |
| 2003/0040948 A1 | * 2/2003 | Sakaguchi | ...................... 705/7 |
| 2003/0083757 A1 | * 5/2003 | Card et al. | ..................... 700/28 |

FOREIGN PATENT DOCUMENTS

| | | |
|---|---|---|
| EP | 0 660 385 A2 | 6/1995 |
| EP | 1 253 497 A1 | 10/2002 |
| WO | WO 01/80306 A2 | 10/2001 |
| WO | WO 02/077589 A2 | 10/2002 |

OTHER PUBLICATIONS

International Search Report, PCT/US 03/28682, mailed May 3, 2004.

* cited by examiner

*Primary Examiner*—Paul Rodriguez
(74) *Attorney, Agent, or Firm*—Amin & Turocy, LLP

(57) ABSTRACT

The present invention provides systems and methods that facilitate performing fabrication process. Critical parameters are valued collectively as a quality matrix, which weights respective parameters according to their importance to one or more design goals. The critical parameters are weighted by coefficients according to information such as, product design, simulation, test results, yield data, electrical data and the like. The invention then can develop a quality index which is a composite "score" of the current fabrication process. A control system can then do comparisons of the quality index with design specifications in order to determine if the current fabrication process is acceptable. If the process is unacceptable, test parameters can be modified for ongoing processes and the process can be re-worked and re-performed for completed processes. As such, respective layers of a device can be customized for different specifications and quality index depending on product designs and yields.

27 Claims, 7 Drawing Sheets

COMPREHENSIVE INTEGRATED LITHOGRAPHIC PROCESS CONTROL SYSTEM BASED ON PRODUCT DESIGN AND YIELD FEEDBACK SYSTEM

FIELD OF INVENTION

The present invention relates generally to semiconductor fabrication and, in particular, to a process control system that employs product design and yield feedback.

BACKGROUND OF THE INVENTION

In the semiconductor industry there is a continuing trend toward increasing device densities, throughput and yield. To increase device densities there have been, and continue to be, efforts toward scaling down semiconductor device dimensions (e.g., at sub-micron levels). In order to accomplish such densities, smaller feature sizes and more precise feature shapes are required. This may include the width and spacing of interconnecting lines, spacing and diameter of contact holes, and the surface geometry, such as corners and edges, of various features. To increase throughput, the number of required processing steps can be reduced and/or the time required for those processing steps can be reduced. To increase yield, which is the percentage of finished products leaving a fabrication process as compared to the number of products that entered the fabrication process, control and/or quality of individual fabrication processes can be improved.

Semiconductor fabrication is a manufacturing process employed to create semiconductor devices in and on a wafer surface. Polished, blank wafers come into semiconductor fabrication, and exit with the surface covered with large numbers of semiconductor devices. Semiconductor fabrication includes a large number of steps and/or processes that control and build the devices—basic processes utilized are layering, doping, heat treatments and patterning. Layering is an operation that adds thin layers to the wafer surface. Layers can be, for example, insulators, semiconductors and/or conductors and are grown or deposited via a variety of processes. Some common deposition techniques are chemical vapor deposition (CVD), evaporation and sputtering. Doping is the process that adds specific amounts of dopants to the wafer surface. The dopants can cause the properties of layers to be modified (e.g., change a semiconductor to a conductor). A number of techniques, such as thermal diffusion and ion implantation can be employed for doping. Heat treatments are another basic operation in which a wafer is heated and cooled to achieve specific results. Typically, in heat treatment operations, no additional material is added or removed from the wafer, although contaminates and vapors may evaporate from the wafer. One common heat treatment is annealing, which repairs damage to crystal structure of a wafer/device generally caused by doping operations. Other heat treatments, such as alloying and driving of solvents, are also employed in semiconductor fabrication.

Patterning is a series of steps that results in the removal of selected portions of surface layers. After removal, a pattern of the layer is left on the wafer surface. The material removed can be, for example, in the form of a hole in the layer or a remaining island of the material. The patterning transfer process is also referred to as photomasking, masking, photolithography or microlithography. The actual subtractive patterning (i.e., removal of material from the surface film) is performed by plasma etching. The goal of the patterning process is to create desired shapes in desired dimensions (e.g., feature size) as required by a circuit design and to locate them in their proper location on the wafer surface. Patterning is generally considered the most important of the four basic processes.

Generally, a process control system is employed to perform one or more patterning or lithography processes. The process control system controls various parameters of the process such as, development time, resist flow and the like. Additionally, the process control system monitors characteristics such as etch rate, dimensions, features size and the like in order to determine whether fabricated devices are acceptable. The patterning or lithography processes are required to be performed and generate results within a historical tolerance, referred to as control limit(s) (e.g., +/−10%). However, these control limit(s) fail to account for specific design requirements or product yields and can thus permit unacceptable devices to be deemed acceptable and acceptable devices to be deemed unacceptable.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present invention relates generally to semiconductor fabrication and, in particular, to an integrated process control system that employs particular product designs. By tailoring semiconductor fabrication processes to specific product designs, device fabrication throughput and yield can be increased.

The present invention tailors semiconductor fabrication processes according to process control parameters such as critical dimensions (CD), overlay, and defect. The process control parameters are not valued individually in serial, but are combined into a quality matrix. The quality matrix is based on parameter inputs together with known data banks from product design, simulation, test results, yield data, electrical data and the like. A process control system can then do comparisons of the quality index with design specifications, which is not conventionally performed. Thus, respective layers can be customized for different specifications and quality index depending on product designs and yields.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
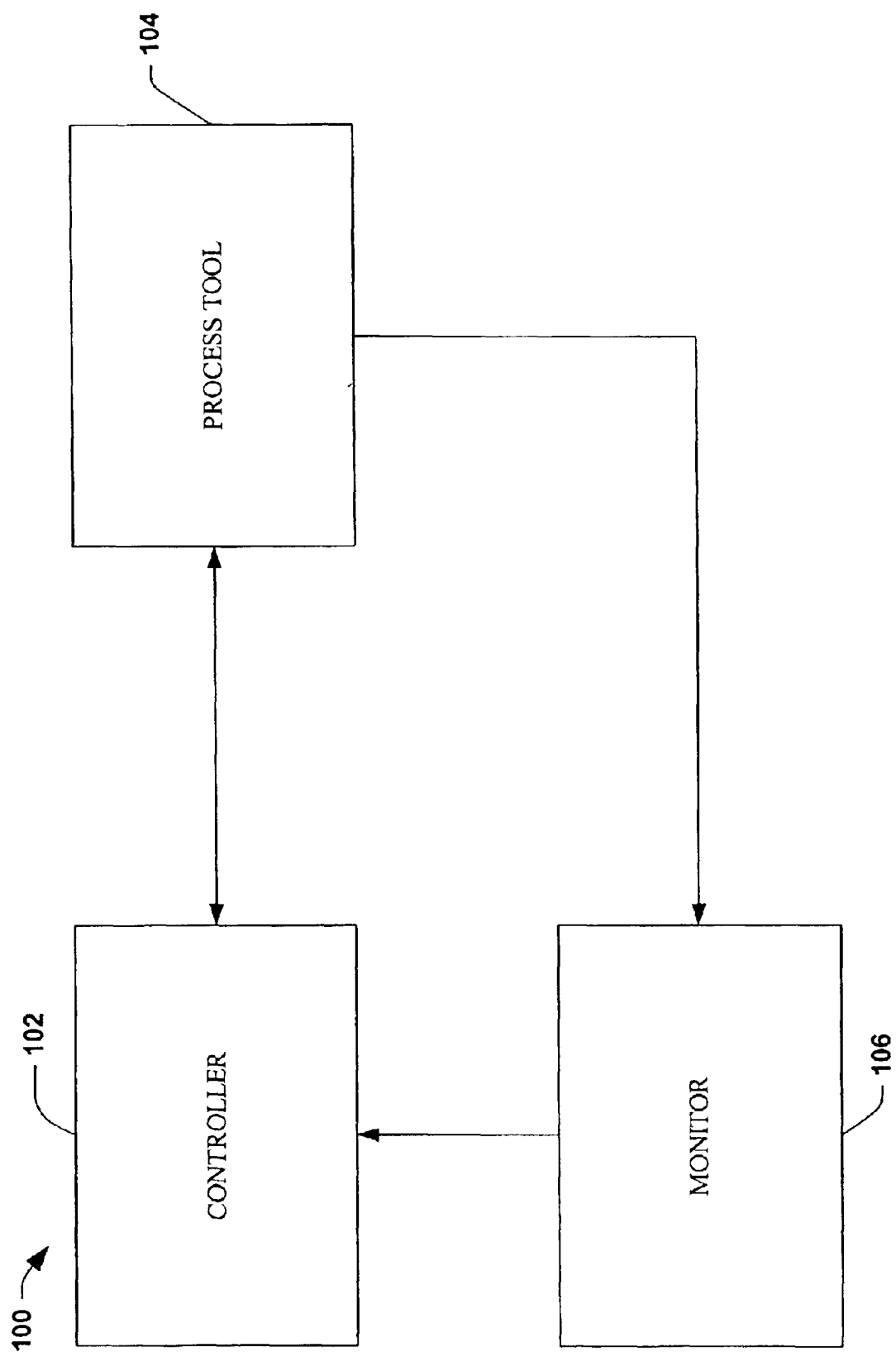
FIG. 1 is a block diagram illustrating a control system in accordance with an aspect of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

As used in this application, the term "computer component" is intended to refer to a computer-related entity, either hardware, a combination of hardware and software, software, or software in execution. For example, a computer component may be, but is not limited to being, a process running on a processor, a processor, an object, an executable, a thread of execution, a program, and/or a computer. By way of illustration, both an application running on a server and the server can be a computer component. One or more computer components may reside within a process and/or thread of execution and a component may be localized on one computer and/or distributed between two or more computers.

The present invention tailors lithographic processes according to process control parameters such as critical dimensions (CD), overlay, and defect. The process control parameters, referred to as critical parameters, are valued collectively as a quality matrix. The quality matrix is based on the critical parameters weighted by coefficients according to information such as, but not limited to, product design, simulation, test results, yield data, electrical data and the like. The invention then can develop a quality index which is a composite "score" of the current fabrication process. A control system can then do comparisons of the quality index with design specifications in order to determine if the current fabrication process is acceptable. If the process is unacceptable, test parameters can be modified for ongoing processes and the process can be re-worked and re-performed for completed processes.

Referring to FIG. 1, a block diagram of a control system 100 in accordance with an aspect of the present invention is presented. The system 100 includes a controller 102, a process tool 104 and a monitor component 106. The system 10 facilitates fabrication of semiconductor devices by monitoring and examining critical parameters of a fabrication process (e.g., a current fabrication process), collectively as opposed to individually. The system 100 can then, if the current process has been performed acceptably, continue with other fabrication processes. Alternately, if the system 100 determines that the current process has not been performed acceptably, re-work and re-perform the process. Additionally, if the process cannot be re-performed properly, the semiconductor device may be discarded.

The controller 102 is operative to interface with the process tool 104 so as to controllably perform the fabrication process. The controller 102 determines and controls a number of test parameters for the fabrication process such as flow rate, resist composition, duration of process, temperature and the like. The fabrication process is but one of many fabrication processes required for a particular semiconductor device (e.g., memory device).

Additionally, the controller 102 is operative to re-perform a fabrication process on being so instructed by the monitor component 106. It is appreciated that some types of fabrication processes (e.g., an etch process that has over etched and substantially damaged a device cannot simply be undone). For such processes, the devices can be discarded. However, a number of fabrication processes are sufficiently suitable to be re-performed. For example, a patterning process, which generally involves depositing a layer of photoresist, selectively exposing portions of the photoresist and selectively removing portions of the photoresist, can be re-worked by removing the photoresist. Then, the patterning process can once again be repeated with new process parameters that can achieve desired results.

In addition to repeating the fabrication process, the controller 102 can also modify the fabrication process in situ. Feedback data can be provided via the monitor component indicating necessary adjustments to process parameters, if any that may improve the fabrication process. These adjustments are not a function of a single critical parameter, but are a function of a group of critical parameters, product design, device yield and the like.

As stated supra, the process tool 104 is controlled by the controller 102. The process tool 104 is the system component that physically and controllably performs the fabrication process (e.g., by dispensing resist, patterning, rotating a wafer, etching and the like) according to test parameters. Additionally, the process tool 104 includes devices that gather fabrication information during fabrication (e.g., in situ) and/or after fabrication (e.g., inspection). This fabrication information can include, for example, critical dimensions (e.g., in x and y directions, width and pitch (2D and 3D), temperature, pressure, overlay, defect and the like). Pitch measurements are measurements between substantially equivalent features. Width measurements are measurements of a single feature. Typically, devices such as scanning electron microscopes (SEM) and optical microscopy are utilized to obtain the measurements. For a SEM, a probe is initially employed to interact with a feature being measured. Then, a signal is generated containing information and is subsequently converted to a measurement. The signal is essentially a record of electron emissions as a function of an electron beam's position on a surface struck by the electron beam. For optical microscopy, a signal such as a diffraction pattern is employed to obtain a measurement.

The monitor component 106 obtains the fabrication information from the process tool 104 and can provide control information to the controller 102. The control information generated by the monitor component 106 can include commands that cause the controller 102 to re-perform a particular process and/or to modify a current process.

Additionally, the monitor component 106 generates a quality matrix based on the fabrication information. The quality matrix comprises a plurality of parameters (e.g., critical dimensions, width, pitch, overlay, defect, and the like) and an associated weight for each parameter. The weights associated with parameters are determined according to product yield and fabrication design models so as to properly weigh the effects of the parameters. Then, a quality index is computed as a function the quality matrix and, because the quality matrix comprises a plurality of parameters, the quality index is necessarily a function of the plurality of parameters in the quality matrix. The quality index can be expressed as a percentage from 0 to 100, wherein 0 indicates that the fabrication process is substantially erroneous, 100 indicates that the fabrication process is substantially correct, and other values indicate various degrees of compliance with design parameters and/or goals. Other suitable metrics can be employed for the quality index. Acceptable tolerance levels can be determined for the semiconductor device and/or the fabrication process. For example, a tolerance of 15 percent permits or deems acceptable, quality index values of 85 percent or better. The acceptable tolerance levels typically can vary by device and/or process. It is important to note that the tolerance levels, quality index and quality matrix are based on composites of the plurality of parameters, not a single parameter.

It is possible that the designed test parameters can result in fabrication results that are less than expected or even out of the acceptable tolerance levels. Simulations, modeling, neural networks, Bayesian networks, Bayesian belief networks and other mechanisms employed to determine the test parameters can produce results different than as expected under real world conditions. A Bayesian belief network is described in further detail infra. Thus, adjustment and/or correction of the test parameters in situ can be performed to compensate for these discrepancies. As stated supra, the monitor component 106 is operative to provide information and/or commands to the controller 102 to modify the current fabrication process. That information produces modifications to the test parameters of the fabrication process that are intended to push the plurality of parameters closer to desired values. Thus, the fabrication process can be modified so as to become acceptable (e.g., where quality index is out of an acceptable range) and/or to be closer to design specifications.

After the fabrication process is completed, post process inspection measurements are obtained by the process tool 104 and provided to the monitor component 106 as the plurality of parameters. The post process inspection measurements can be more extensive than measurements in situ (e.g., by measuring in multiple directions). For such inspections, the quality index is employed to determine whether the results of the fabrication process are acceptable. If the quality index is not acceptable (e.g., within the acceptable tolerance values), the fabrication process can be re-performed, if possible. If the process cannot be re-performed, the semiconductor device may have to be discarded or identified as non-operable. On being acceptable, the semiconductor device can then continue to another stage of device fabrication. Additionally, the quality index, the quality matrix and other information associated with the fabrication process can be stored and/or employed to further develop later test parameters, quality matrices and quality indexes for subsequent fabrication processes.

The system 100 has been described as operating in situ and post process. However, it is appreciated that the system 100 can be implemented and/or employed so as to operate in situ, post process, or both.

Figure 2:
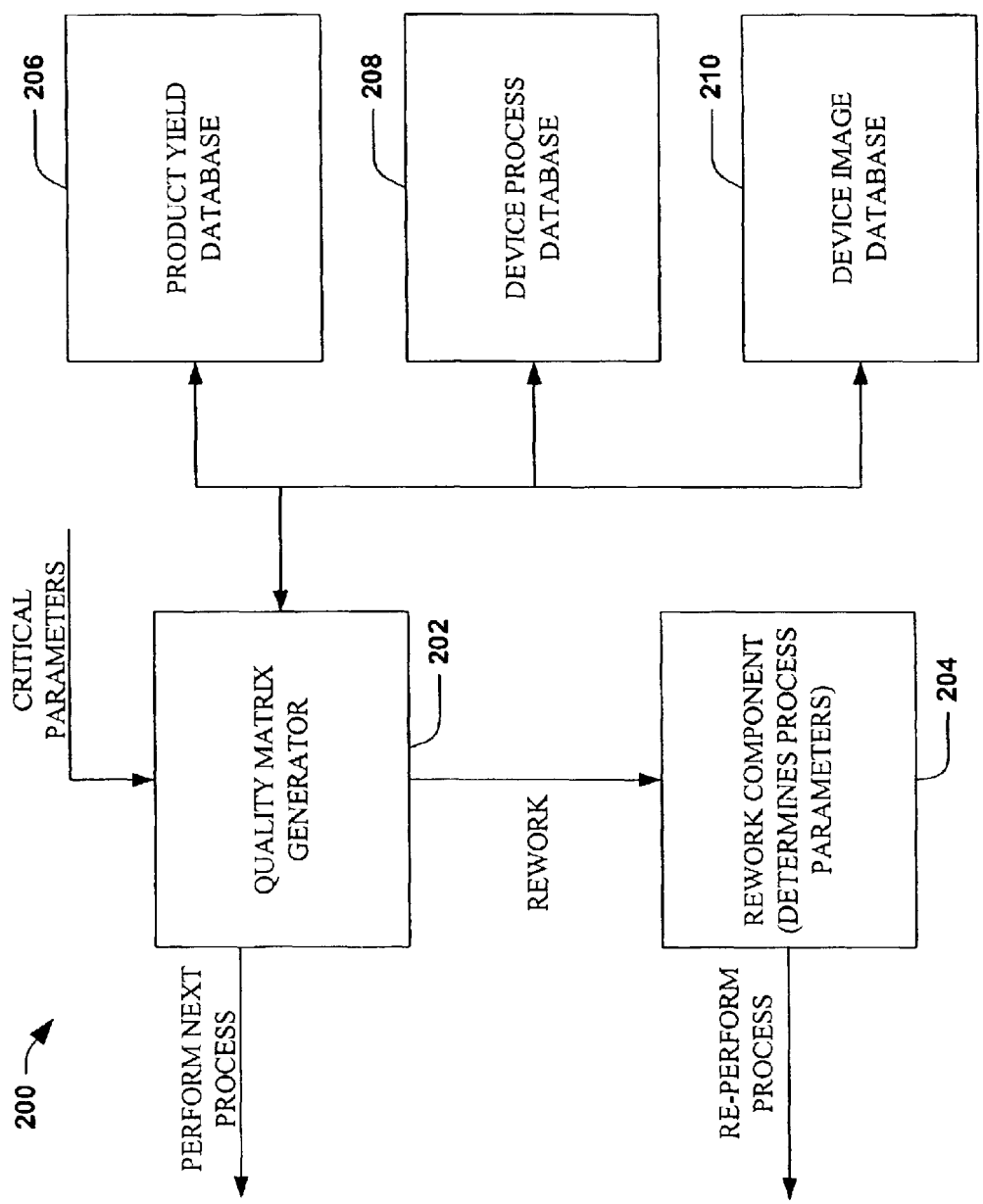
FIG. 2 is a block diagram illustrating a system that facilitates semiconductor device fabrication in accordance with an aspect of the present invention.

Referring now to FIG. 2, a system 200 that facilitates semiconductor device fabrication in accordance with an aspect of the present invention is disclosed. The system 200 includes a quality matrix generator 202, a re-work component 204, a product yield database 206, a device process database 208 and a device image database 210. The system 200 receives a plurality of critical parameters as a result of a post process inspection and at least partially determines whether a completed fabrication process is acceptable. This decision is based on a composite and/or combination of the plurality of critical parameters instead of serially considering parameters individually. Generally, the system 200 makes a decision as to whether to re-work the completed fabrication process or to continue processing of a semiconductor device to a subsequent stage. The system 200 can be implemented as part of a control system such as the control system 100 of FIG. 1, discussed supra.

The quality matrix generator 202 receives the plurality of critical parameters of a post process inspection for a semiconductor device and determines how processing should continue. These critical parameters include critical measurements, such as, x direction measurements, y direction measurements, width (e.g., 2D and 3D), pitch (e.g., 2D and 3D), temperature, pressure, overlay, defects and the like.

The quality matrix generator 202 builds a matrix, referred to as a quality matrix, wherein entries or points of the matrix represent a single critical parameter with a weighting coefficient. This representation can be expressed mathematically as follows:

$$\text{parameter} = w \times a \quad (1)$$

where $\alpha$ is the expected value for the parameter and $\omega$ is a coefficient. Additionally, a constant value can also be associated with each parameter. Rows of the quality matrix typically comprise the plurality of critical parameters and their associated weights. There can be one or more rows, wherein respective rows correspond to particular design/fabrication goals such as device yield. It is appreciated that the quality matrix can only have one row and still be in accordance with the present invention. Additionally, weights for respective parameters can vary by row according to design goals.

As such, the quality matrix can be generated and expressed as:

$$\begin{bmatrix} w_{11}a_{11} & w_{12}a_{12} & \ldots & w_{11}a_{1m} \\ w_{21}a_{21} & w_{22}a_{22} & \ldots & w_{2m}a_{2m} \\ \vdots & & & \\ w_{nl}a_{nl} & w_{n2}a_{n2} & \ldots & w_{nm}a_{nm} \end{bmatrix} \quad (2)$$

Then, the quality matrix generator computes the coefficients by analyzing design performance goals, design rules, product yield and the like. After so doing, an index value can be computed for the quality matrix in a suitable manner. One suitable manner is to sum the matrix components into a final value, referred to as a quality index, according to Eqs. (3–4) as depicted here:

$$w_{11}a_{11} + w_{12}a_{12} + \ldots + w_{11}a_{1m} \quad (3)$$
$$w_{21}a_{21} + w_{22}a_{22} + \ldots + w_{2m}a_{2m}$$
$$\vdots$$
$$w_{nl}a_{nl} + w_{n2}a_{n2} + \ldots + w_{nm}a_{nm}$$

$$\sum_{j=1}^{n}\sum_{i=1}^{m} w_{ij} \times a_{ij} \quad (4)$$

The quality index can then be weighted to be a percentage representing closeness to design/product goals.

The quality matrix generator 202 interacts with the product yield database 206, the device process database 208 and the device image database 210 in order to determine coefficients and acceptable quality index values. The product yield database 206 includes information related to product yield goals for the current semiconductor device and stage of fabrication. This information is especially useful for determining coefficients and interrelationships of critical parameters with respect to yield. The device process database 208 includes information related to a variety of fabrication processes, including the previously completed fabrication process for the current device. This information assists in determining the coefficient values. Additionally, this information can relate expected critical parameters with the actual, measured critical parameters and can be employed to suggest modifications in subsequent processes. The device image database includes two dimensional and three dimensional images of device design and layouts. This information can be utilized to identify discrepancies between an image of the semiconductor device after the current fabrication process and expected images for that stage of fabrication. It is appreciated that additional databases and/or information can be employed by the quality matrix generator 202.

Based on the computed quality index, the quality matrix generator 202 can signal to perform a next process or can indicate to the re-work component 204 that the current fabrication process should be reworked or re-performed. The rework component 204 causes the semiconductor device to be reinstated to the processing stage just prior to the current fabrication process. Typically, this can be accomplished by reversing the process (e.g., by removing the patterned photoresist).

Additionally, the rework component 204 computes modifications or adjustments to test parameters employed in the completed fabrication process. The modifications are such that a next fabrication process should result in an acceptable quality index and/or an acceptable semiconductor device. The rework component 204 can interact with the product yield database 206, the device process database 208 and the device image database, although, for simplicity, FIG. 2 is not so illustrated.

It is appreciated that an alternate aspect of the present invention includes variations of the system 200 of FIG. 2 that permit operation and modification of test parameters during fabrication processing.

Figure 3:
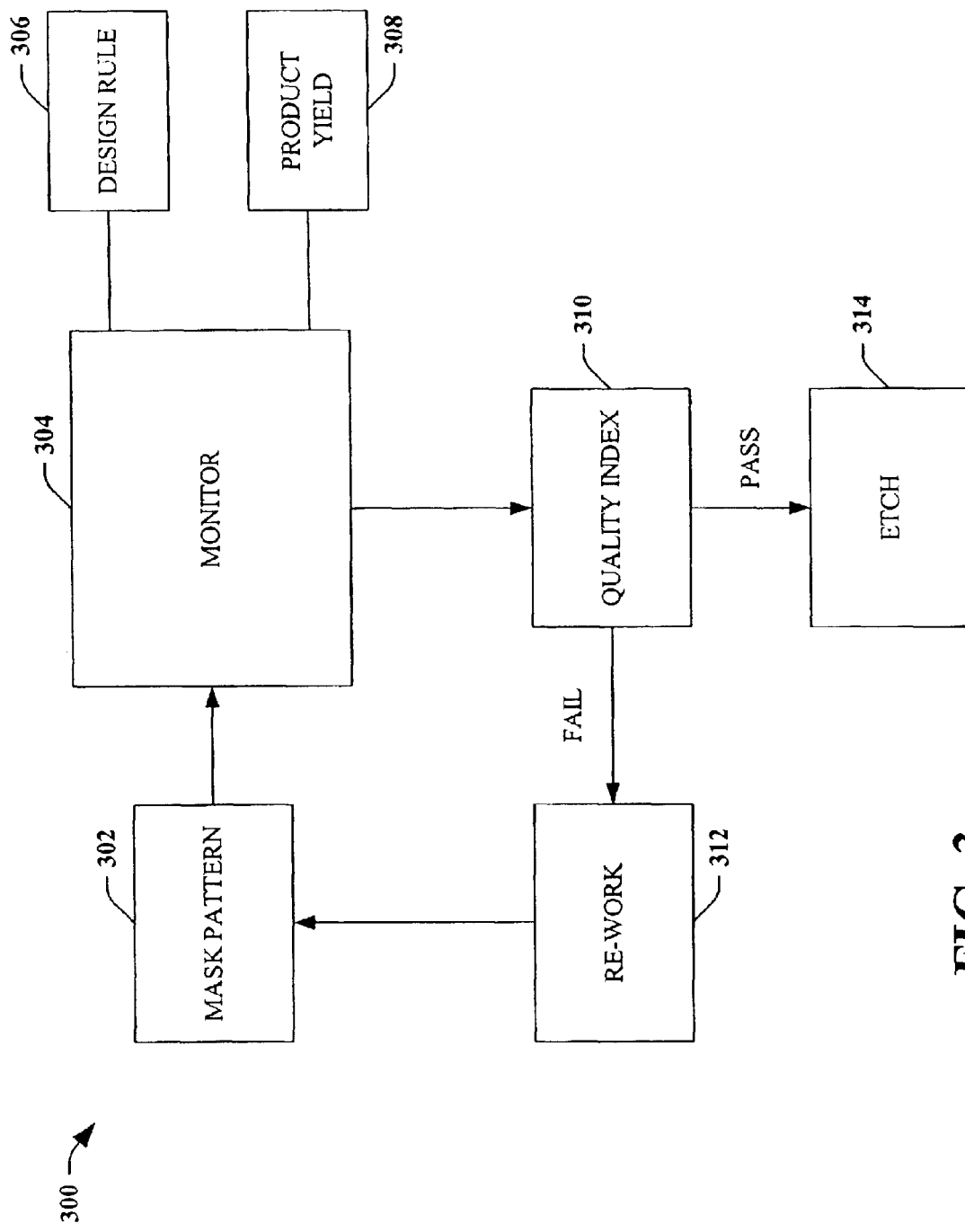
FIG. 3 is a block diagram illustrating a lithographic control system in accordance with an aspect of the present invention.

FIG. 3 is a block diagram depicting a lithographic control system 300 in accordance with an aspect of the present invention. The system 300 operates in a similar fashion as that of system 100 of FIG. 1. However, the system 300 is specifically tailored for lithographic fabrication processes. The system 300 is operative to employ device information such as design rules and product yield in order to control a lithographic process. The system 300 includes a mask pattern component 302, a monitor component 304, a design rule component 306, a product yield component 308, a quality index component 310, a mask re-work component 312 and an etch component 314.

The mask pattern component 302 performs a patterning process on a semiconductor device according to a number of determined test parameters. A mask reticle is employed as part of the process and comprises an array of patterns in accordance with the test parameters covering a glass plate. The mask consists of opaque and clear areas that respectively prevent or allow light through. The mask can be aligned with existing patterns and/or devices on wafers to selectively expose photoresist and is typically obtained via a design process. The mask can be formed on the glass plate in emulsion, chrome, iron oxide, silicon or another suitable opaque material. After being exposed, selected portions of the photoresist are developed and then removed.

The monitor component 304 analyzed the semiconductor device(s) after the patterning process has been performed by the mask pattern component 302. The monitor component obtains a plurality of critical parameters via a post inspection process. The critical parameters include, for example, critical dimensions, overlay, defect and the like. The test parameters are then organized into a quality matrix wherein each point includes an expected value for a parameter and a coefficient or weight associated with that parameter. For brevity, a detailed discussion of generation of this matrix is omitted and has been discussed supra with respect to FIG. 1 and FIG. 2. Briefly, the coefficients can be determined by referencing the design rule component 306 and the product yield component 308. Once the quality matrix is generated, a range of acceptable index values is determined, which includes ranges wherein the performed mask/pattern process meets or exceeds acceptable values. However, unlike conventional control systems, the range of values is based on a plurality of the critical parameters, design goals, and or semiconductor device. For example, some devices allow more tolerances in defects whereas other devices permit greater tolerances in critical dimensions. By accounting for these differences, a more suitable range of acceptable values can be obtained.

Subsequently, a quality index 310 is generated for the semiconductor device(s). The quality index 310 is generally expressed as a percentage type value. The monitor component 304 can utilize expected parameter values with known data banks from product design simulation, test results, yield data, electrical data and the like. A simulation of the desired etch process can then be compared with two dimensional and three dimensional design and/or layout images to determine if the current parameter values yield acceptable results by facilitating generation of the quality index 310.

If the quality index 310 computed by the monitor component 304 is within the acceptable range, the etch component 314 continues with performing an etch process on the semiconductor device(s). Due to the patterning process, post inspection, quality matrix, quality index employed supra, the etch process is substantially able to produce etching results within expected tolerances.

If the quality index 310 fails to fall within the acceptable range, the re-work component 312 undoes the completed process and causes the mask pattern component 302 to re-perform the mask pattern process. The rework component 312 undoes the masking operation by removing the remaining photoresist and, optionally, performing a cleaning process. As such, the semiconductor device(s) is in substantially the same processing state as it was prior to the original patterning operation performed by the mask pattern component 302. Because patterning is a non-destructive process, the process can be repeated a number of times until an acceptable quality index 310 is obtained.

Although system 300 has been described with respect to a lithographic control system, it is appreciated that alternate aspects of the invention can operate and provide control for other types of fabrications processes. In particular, processes that are non-destructive (e.g., such as patterning), can be inspected and re-performed in accordance with the present invention.

The process control system of the present invention can be employed for any suitable fabrication process such as, but not limited to, metallization, patterning, etching, doping, deposition, sputtering, polishing, and the like. Additionally, the process control system of the present invention can be utilized to fabricate semiconductor devices that can be employed in a wide variety of computer and electronic devices such as computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to weight reductions and/or increased computing capacity (e.g., increased processing power and memory storage). Examples of hand-held devices include cell phones and other two way communication devices, personal data assistants, palm pilots, pagers, notebook computers, remote controls, recorders (video and audio), radios, small televisions and web viewers, cameras, and the like.

Figure 4:
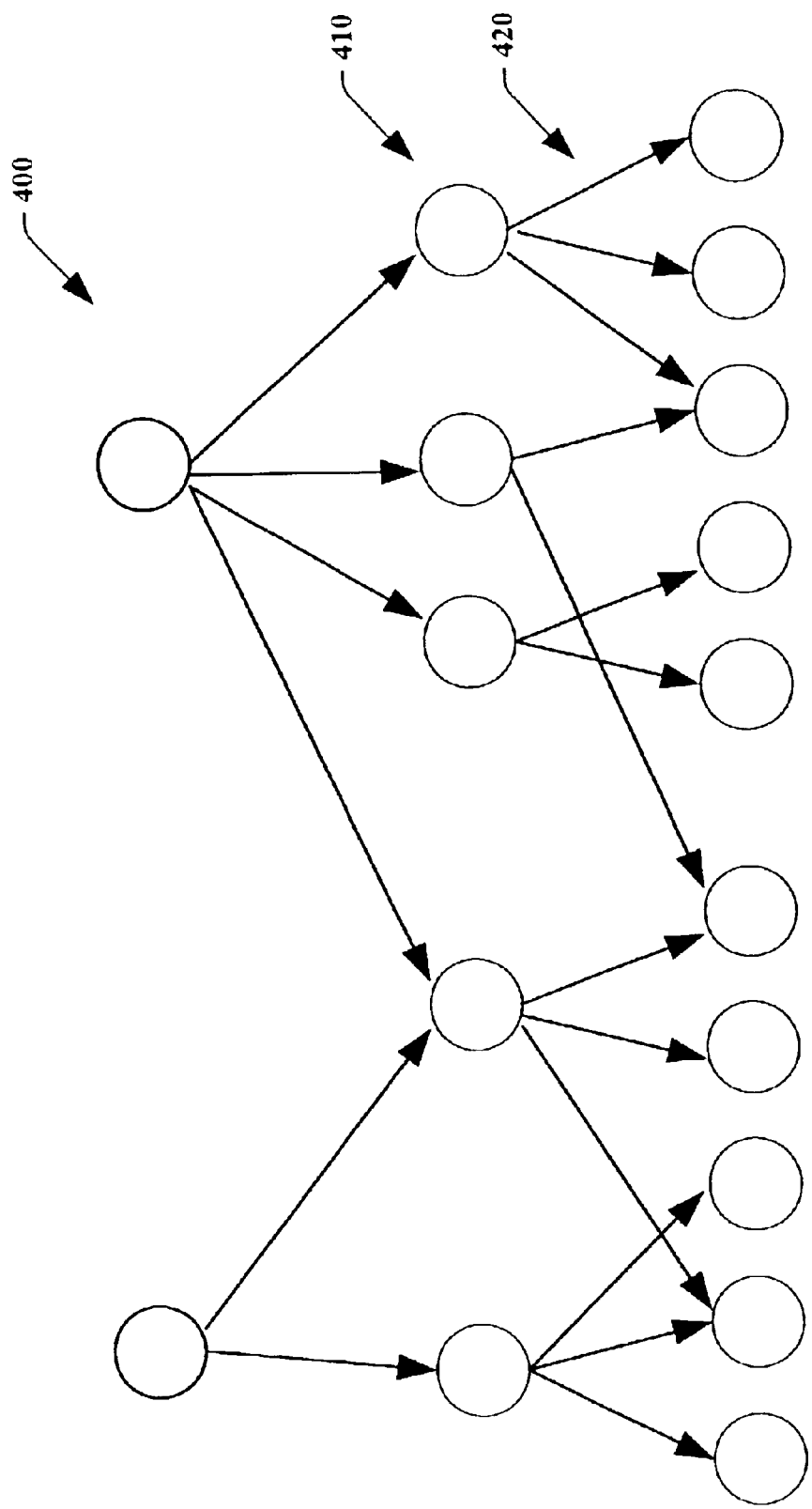
FIG. 4 is a diagram of a representative belief network that can be employed with a control system in accordance with an aspect of the present invention.

FIG. 4 illustrates a representative belief network 400 that can be are used to model semiconductor device fabrication processes. The term "belief networks" as employed herein is intended to encompass a whole range of different but related techniques which deal with reasoning under uncertainty. Both quantitative (mainly using Bayesian probabilistic methods) and qualitative techniques are used. Influence diagrams are an extension to belief networks; they are used when working with decision making. Belief networks are employed to develop knowledge based applications in domains which are characterized by inherent uncertainty. A problem domain is modeled as a set of nodes 410 interconnected with arcs 420 to form a directed acyclic graph as shown in FIG. 4. Each node represents a random variable, or uncertain quantity, which can take two or more possible values. The arcs 420 signify the existence of direct influences between the linked variables, and the strength of each influence is quantified by a forward conditional probability.

Within the belief network the belief of each node (the node's conditional probability) is calculated based on observed evidence. Various methods have been developed for evaluating node beliefs and for performing probabilistic inference. The various schemes are essentially the same—they provide a mechanism to propagate uncertainty in the belief network, and a formalism to combine evidence to determine the belief in a node. Influence diagrams, which are an extension of belief networks, provide facilities for structuring the goals of the diagnosis and for ascertaining the value (the influence) that given information will have when determining a diagnosis. In influence diagrams, there are three types of node: chance nodes, which correspond to the nodes in Bayesian belief networks; utility nodes, which represent the utilities of decisions; and decision nodes, which represent decisions which can be taken to influence the state of the world. Influence diagrams are useful in real world applications where there is often a cost, both in terms of time and money, in obtaining information.

An expectation maximization (EM) algorithm is a common approach for learning in belief networks. In its standard form it does not calculate the full posterior probability distribution of the parameters, but rather focuses in on maximum a posteriori parameter values. The EM algorithm works by taking an iterative approach to inference learning. In the first step, called the E step, the EM algorithm performs inference in the belief network for each of the datum in the dataset. This allows the information from the data to be used, and various necessary statistics S to be calculated from the resulting posterior probabilities. Then in the M step, parameters are chosen to maximize the log posterior logP(T\D,S) given these statistics are fixed. The result is a new set of parameters, with the statistics S which we collected are no longer accurate. Hence the E step must be repeated, then the M step and so on. At each stage the EM algorithm guarantees that the posterior probability must increase. Hence it eventually converges to a local maxima of the log posterior.

Figure 5:
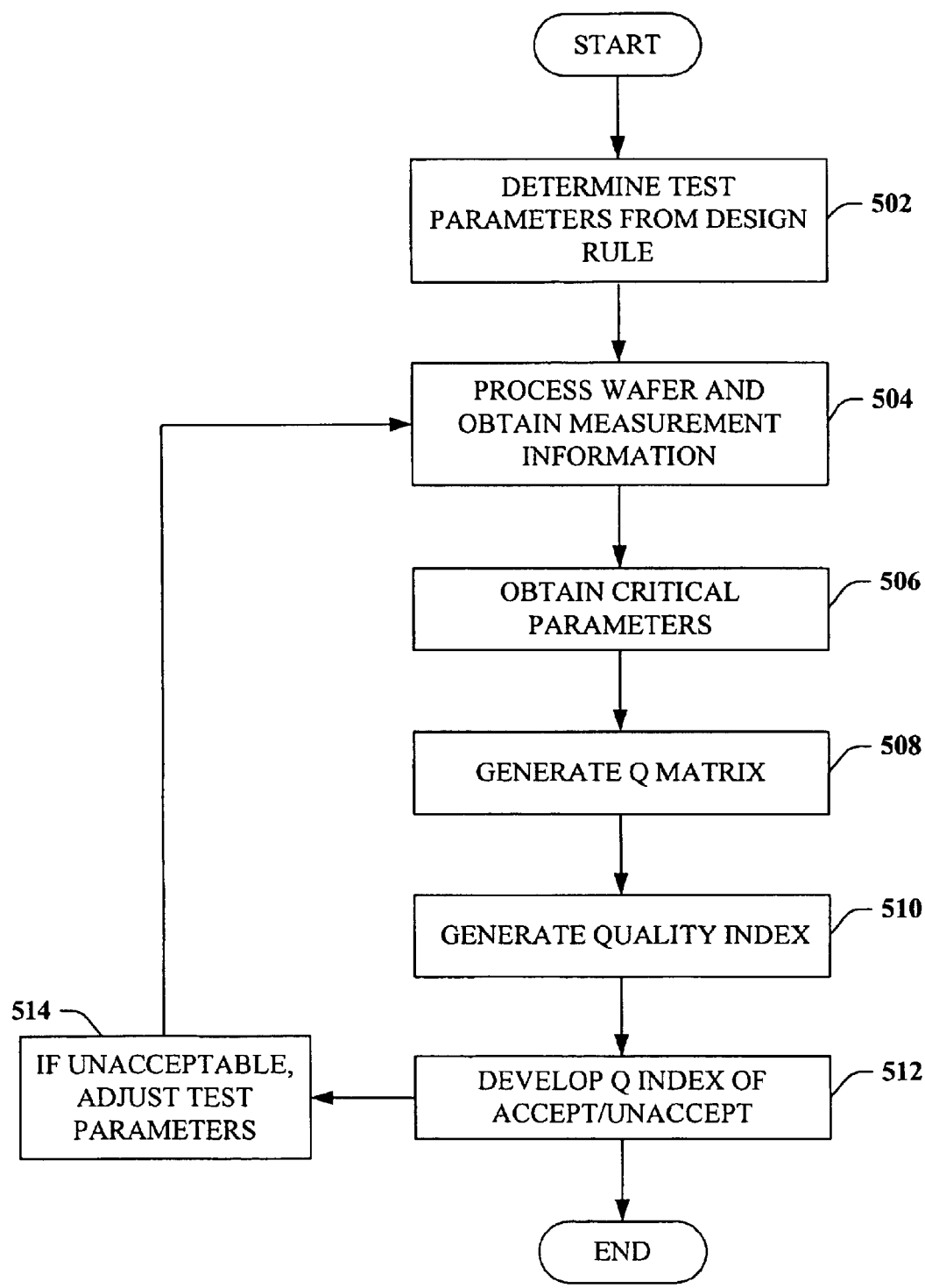
FIG. 5 is a flow diagram illustrating a method that facilitates control of a semiconductor fabrication process in accordance with an aspect of the present invention.
Figure 6:
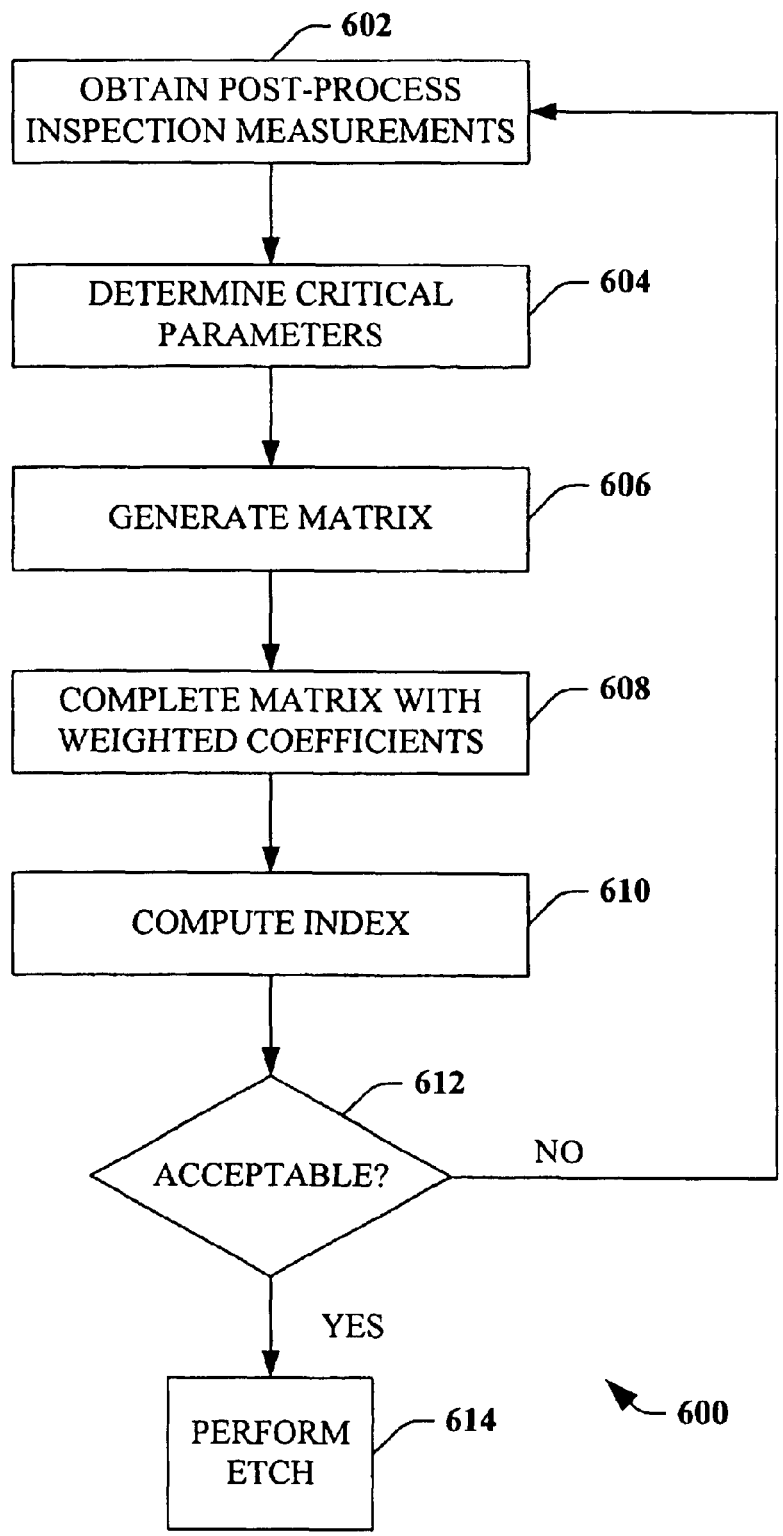
FIG. 6 is a flow diagram illustrating a method of performing a semiconductor fabrication process in accordance with an aspect of the present invention.
Figure 7:
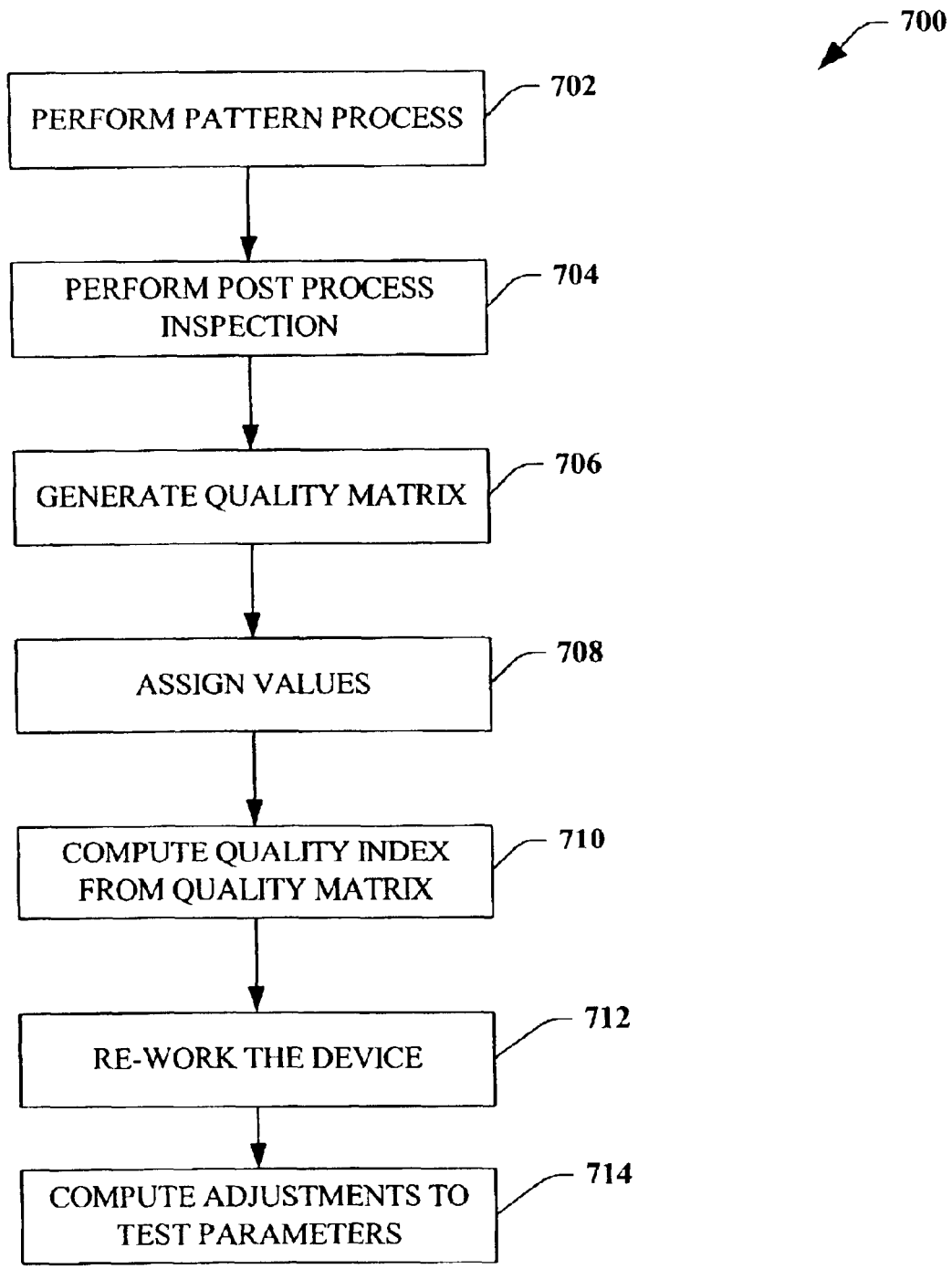
FIG. 7 is a flow diagram illustrating a method of fabricating a semiconductor device in accordance with an aspect of the present invention.

In view of the foregoing structural and functional features described above, methodologies in accordance with various aspects of the present invention will be better appreciated with reference to FIGS. 5–7. While, for purposes of simplicity of explanation, the methodologies of FIGS. 5–7 is depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect of the present invention.

FIG. 5 illustrates a flow diagram of a method 500 that facilitates control of a semiconductor fabrication process. The method 500 increases throughput/yield by considering a plurality of critical parameters comprehensively instead of individually. Thus, a fabrication process can be modified via feedback in situ measurements of various test parameters.

The method 500 begins at 502, where test parameters for a fabrication process are determined. The test parameters are parameters employed in performing the fabrication process such as flow rate, resist composition, duration of process, temperature and the like. The fabrication process is typically but one of many fabrication processes required for a particular semiconductor device (e.g., memory device). Generally, the test parameters are based on product design (e.g., layout information) and previous test/process results and include parameters that control the process, such as, dispensing resist, patterning, rotating a wafer, etching and the like.

Continuing at 504, the fabrication process initiates or continues and measurement information is obtained. Generally, measurement devices are employed that gather information during fabrication (e.g., in situ). This fabrication information can include, for example, critical dimensions (e.g., in x and y directions, width and pitch (2D and 3D), temperature, pressure, overlay, defect and the like). Pitch measurements are measurements between substantially equivalent features. Width measurements are measurements of a single feature. Typically, devices such as scanning electron microscopes (SEM) and optical microscopy are utilized to obtain the measurements, which have been described supra.

The method 500 then continues at 506 where the measurement information is utilized to obtain a plurality of critical parameters. These critical parameters are directly or indirectly related to the measurement information and include critical dimensions, width, pitch, overlay, defect, and the like. Subsequently, a quality matrix is generated at 508 wherein points or entries of the matrix include one of the plurality of critical parameters and an associated weight or coefficient. These weights are a function of product yield and design models. It is appreciated that coefficients for the quality matrix can be established before initiation of the fabrication process. Continuing on at 510, a quality index is generated. The quality index is a function of the entries of the matrix and provides a percentage value indicating performance of the fabrication. A range of acceptable index values are generated at 512. The acceptable values are based at least partly on design goals and yield and tailored for the current semiconductor device.

On the quality index being acceptable, the method 500 continues with the current fabrication process until completed. Otherwise, modifications and/or adjustments are made to the test parameters at 514. These modifications are intended to result in production of a quality index that is acceptable. Then, after adjusting the test parameters at 514, the method 500 continues at 504, wherein the fabrication process continues.

Turning now to FIG. 6, a block diagram of a method 600 that facilitates performing a semiconductor fabrication process in accordance with an aspect of the present invention is depicted. The method 600 analyzes a semiconductor device after a fabrication process has been performed. On the device being deemed unacceptable, the device can be reworked such that the device becomes acceptable.

A number of fabrication processes can be controlled at least in part according to the method 600. Particularly well suited are those processes that can be substantially re-performed. For example, a patterning process, which generally involves depositing a layer of photoresist, selectively exposing portions of the photoresist and selectively removing portions of the photoresist, can be re-worked by removing the photoresist. Then, the patterning process can once again be repeated with new process parameters that can achieve desired results.

After the fabrication process is completed, post process inspection measurements are obtained at 602. The post process inspection measurements can be more extensive than measurements in situ (e.g., by measuring in multiple directions). A more detailed discussion of such measurements are described supra, but omitted here for brevity. The post process measurements are converted directly or indirectly to critical parameters at 604. The critical parameters have been described supra. From these critical parameters, a quality matrix is at least partially constructed at 606 wherein entries of the matrix comprise a critical parameter along with a weighting coefficient. Then, at 608, values for the coefficients associated with the critical parameters are determined, thereby completing the quality matrix. These values are determined as a function of semiconductor device information including, but not limited to, device design, layout, layout analysis, yield, and the like.

Continuing on at 610, the method 600 computes a quality index from the quality matrix. The quality index can be a summation of the entries of the matrix and scaled such that it is represented as a percentage. Then, a determination is made regarding whether index values fall within an acceptable range of index values at 612. The acceptable range is a function of substantially all the test parameters, collectively. Finally, the semiconductor device is re-worked and the fabrication process is continued via an etch process at 614. Generally, if the quality index is not acceptable (e.g., within the acceptable tolerance values), the fabrication process can be re-performed, if possible. If the process cannot be re-performed, the semiconductor device may have to be discarded or identified as non-operable. On being acceptable, the semiconductor device can then continue to another stage of device fabrication. Additionally, the quality index, the quality matrix and other information associated with the fabrication process can be stored and/or employed to further develop later test parameters, quality matrices and quality indexes for subsequent fabrication processes.

FIG. 7 illustrates a flow diagram of a method 700 of fabricating a semiconductor device in accordance with an aspect of the present invention. Generally, the method 700 performs a patterning process, analyzes the device after performing the process and re-performs the process as necessary. By so doing, damage and improper fabrication to semiconductor devices can sometimes be avoided.

The method 700 begins at 702 where a patterning process is performed according to a number of test parameters. After completion of the process, a post process inspection is performed at 704 and critical measurements referred to as critical parameters are obtained. Subsequently, a quality matrix is generated at 706, wherein entries of the matrix comprise a critical parameter and a weighted coefficient. Values are assigned at 708 for the matrix and indicate relative importance of the critical parameters with each other and their effect on one or more process goals (e.g., yield, dimensions . . . ). Then, a quality index is computed from the quality matrix at 710. The quality index is typically a percentage.

On the quality index indicating that the results are unacceptable (e.g., outside of determined acceptable index ranges), the device is re-worked at 712 where the photoresist is removed. Adjustments to the test parameters are then computed at 714 so as to permit future patterning processes to be performed closer to expected/desired values. Subsequently, the method 700 continues at 702 where the patterning process is re-performed according to the recently developed adjustments to the test parameters.

What has been described above are one or more aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description and the claims, such term is intended to be inclusive in a manner similar to the term "comprising."

What is claimed is:

1. A process control system comprising:
    a controller that controllably performs a fabrication process;
    a process tool that obtains measurement information and is controlled by the controller; and
    a monitor component that collectively analyzes the measurement information, appropriately weights the information, determines whether the fabrication process is acceptable, and generates a quality matrix based on critical parameters determined from the measurement information;
    the critical parameters comprise at least two of: critical dimensions, defects, and layout dimensions.

2. The system of claim 1, the quality matrix comprising a plurality of critical parameters and weighted coefficients, the critical parameters being directly and/or indirectly related to the measurement information.

3. The system of claim 1, the measurement information being obtained in situ.

4. The system of claim 1, the measurement information being obtained from a post process inspection.

5. The system of claim 1, the monitor component being further operative to determining the fabrication process unacceptable and to modify test parameters employed by the controller.

6. The system of claim 1, the monitor component being further operative to determine that the fabrication process is unacceptable, to modify test parameters, and to cause the controller to re-perform the fabrication process.

7. The system of claim 1, the fabrication process being a patterning process.

8. The system of claim 1, the fabrication process being an etching process.

9. The system of claim 1, the fabrication process being a metallization process.

10. A fabrication monitoring system comprising:
   at least one database that maintains device related information for a fabrication process for a semiconductor device;
   a quality matrix generator that obtains critical parameters and develops a quality matrix based at least in part on the critical parameters and generates a quality index, the quality index being representative of a relationship of the critical parameters and expected parameters;
   the critical parameters comprise at least two of: critical dimensions, detected defects, and layout dimensions.

11. The system of claim 10, the quality index being a percentage type value.

12. The system of claim 10, the quality matrix comprising at least one row, respective rows of the at least one row being correlate with a process goal.

13. The system of claim 12, one row of the at least one row being correlated with product yield.

14. The system of claim 12, the at least one database comprising a device process database, a product yield database, and a device image database.

15. The system of claim 12, the quality matrix comprising, for respective rows of the quality matrix, the critical parameters and weighted coefficients associated with the critical parameters.

16. The system of claim 15, the weighted coefficients respectively indicating relevance of the associated critical parameters.

17. The system of claim 15, further comprising a re-work component operative to rework the semiconductor device on the quality index indicating that results of the fabrication process are unacceptable.

18. A method of performing a fabrication process on a semiconductor device comprising:
   obtaining critical parameters based on measurements of the semiconductor device;
   generating a quality matrix, wherein respective points of the quality matrix comprise one of the critical parameters and a weighted coefficient; and
   generating a quality index as a function of the quality matrix, the quality index indicating a collective acceptability of the fabrication process;
   the critical parameters comprise at least two of: critical dimensions, defect information, and layout dimensions.

19. The method of claim 18, further comprising determining test parameters for the fabrication process prior to obtaining the critical parameters.

20. The method of claim 18, further comprising defining an acceptable range of index values to which the quality index can be compared to determine whether the fabrication process is acceptable.

21. The method of claim 18, further comprising modifying test parameters for the fabrication process based at least partly on the quality matrix and the quality index.

22. The method of claim 18, further comprising reversing effects of the fabrication process on the semiconductor device on the quality index indicating that the fabrication process is unacceptable.

23. The method of claim 18, further comprising obtaining the measurements during a post process inspection.

24. The method of claim 18, wherein the fabrication process is a patterning process.

25. The method of claim 24, further comprising performing an etch process on the semiconductor device on the quality index indicating that the fabrication process has performed acceptably.

26. A system that facilitates a fabrication process comprising:
   means for obtaining critical parameters of the fabrication process for a semiconductor device;
   means for generating a quality matrix wherein respective points of the quality matrix comprise one of the critical parameters and a weighted coefficient;
   means for determining the weighted coefficients; and
   means for generating a quality index as a function of the quality matrix, the quality index indicating a collective acceptability of the fabrication process;
   the critical parameters comprise at least two of: critical dimensions, defect information, and overlay dimensions.

27. The system of claim 26 employing a Bayesian belief network in connection with at least one of: generating the quality matrix, determining the weighted coefficients, and generating the quality index.

* * * * *

UNITED STATES PATENT AND TRADEMARK OFFICE
CERTIFICATE OF CORRECTION

PATENT NO. : 6,915,177 B2 Page 1 of 1
DATED : July 5, 2005
INVENTOR(S) : Phan et al.

It is certified that error appears in the above-identified patent and that said Letters Patent is hereby corrected as shown below:

Column 3,
Line 63, change "10" to -- 100 --.

Column 9,
Line 25, change "can be are" to -- are --.

Column 10,
Line 24, change "with an aspect the present invention" to -- with an aspect of the present invention --.

Column 12,
Line 46, change "and" to -- or --.

Column 13,
Lines 36 and 39, change "12" to -- 10 --.
Line 46, change "15" to -- 10 --.

Signed and Sealed this

Fourteenth Day of March, 2006

JON W. DUDAS
*Director of the United States Patent and Trademark Office*